(12) United States Patent
Hamilton et al.

(10) Patent No.: US 10,863,117 B2
(45) Date of Patent: Dec. 8, 2020

(54) APPARATUS FOR DYNAMIC RANGE ENHANCEMENT

(71) Applicant: Dialog Semiconductor (UK) Limited, London (GB)

(72) Inventors: Joseph Hamilton, Edinburgh (GB); Fryderyk Fijalkowski, Edinburgh (GB)

(73) Assignee: Dialog Semiconductor (UK) Limited, London (GB)

( * ) Notice: Subject to any disclaimer, the term of this patent is extended or adjusted under 35 U.S.C. 154(b) by 0 days.

(21) Appl. No.: 16/176,821

(22) Filed: Oct. 31, 2018

(65) Prior Publication Data

US 2020/0137327 A1    Apr. 30, 2020

(51) Int. Cl.
*H04N 5/355* (2011.01)
*H03M 1/70* (2006.01)
*H04N 5/357* (2011.01)

(52) U.S. Cl.
CPC .............. *H04N 5/355* (2013.01); *H03M 1/70* (2013.01); *H04N 5/357* (2013.01)

(58) Field of Classification Search
CPC ..................................................... H04N 5/355
USPC ....................................................... 348/241
See application file for complete search history.

(56) References Cited

U.S. PATENT DOCUMENTS

| 2013/0228673 | A1* | 9/2013 | Hashimoto | H04N 5/243 |
|---|---|---|---|---|
| | | | | 250/208.1 |
| 2018/0035068 | A1* | 2/2018 | Morimoto | H04N 5/2251 |

* cited by examiner

*Primary Examiner* — Joel W Fosselman
(74) *Attorney, Agent, or Firm* — Saile Ackerman LLC; Stephen B. Ackerman

(57) ABSTRACT

An apparatus for dynamic range enhancement (DRE) which receives an input signal and provides a DRE output signal is presented. The apparatus has an error correction circuit to apply an error correction factor to the input signal such that the DRE output signal provided by the apparatus is dependent on the input signal and the error correction factor. The error correction factor is representative of an error generated by the apparatus.

21 Claims, 16 Drawing Sheets

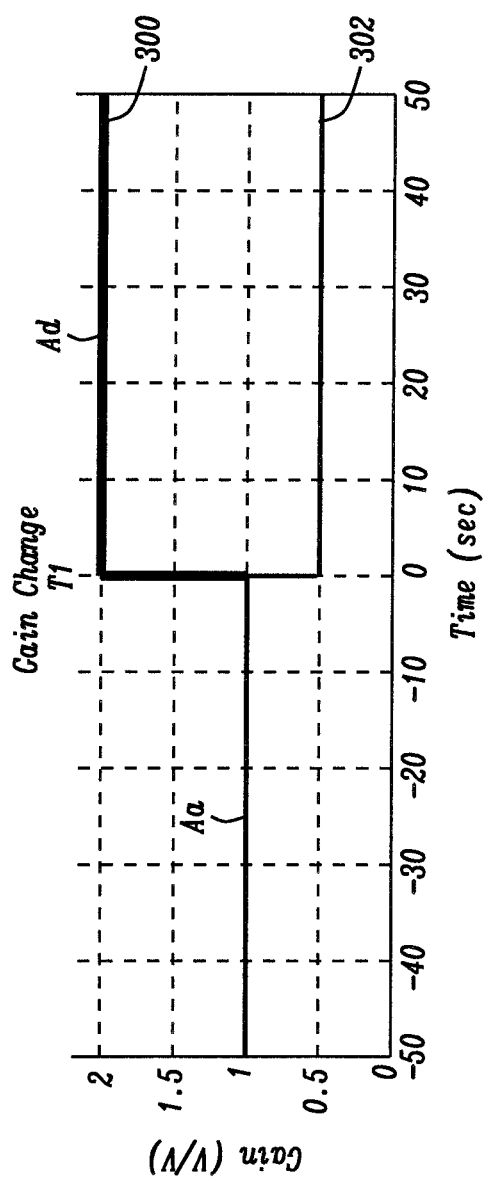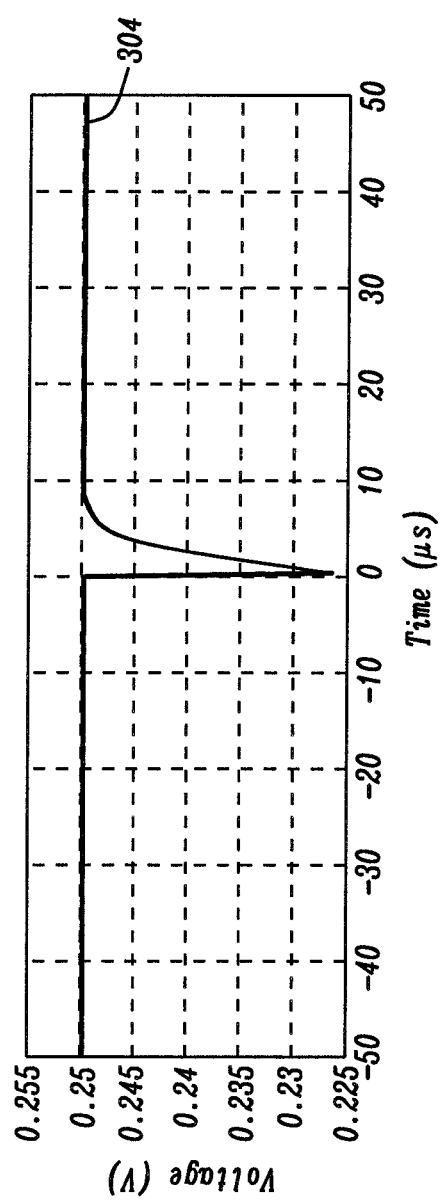
FIG. 3A Prior Art
FIG. 3B Prior Art

APPARATUS FOR DYNAMIC RANGE ENHANCEMENT The present disclosure relates to an apparatus for dynamic range enhancement. In particular, the disclosure relates to an apparatus for dynamic range enhancement comprising an error correction circuit.

BACKGROUND

Dynamic range enhancement (DRE) is a technique that is used to suppress errors in a signal path. DRE amplifies a signal prior to a processing step that introduces errors into the signal and then attenuates the signal after the processing step.

FIG. 1 shows a schematic of a DRE system 100 comprising an amplifier circuit 102, a processing circuit 104 and an attenuation circuit 106. A signal path is formed from a signal path input 108 to a signal path output 110. In the DRE system 100, the signal path input 108 corresponds to an input of the amplifier circuit 102 and the signal path output 110 corresponds to an output of the attenuation circuit 106. In the DRE system 100 of FIG. 1, the amplifier circuit 102 may for example provide a gain of +12 dB and the attenuation circuit 106 may for example provide a gain of −12 dB.

In operation a signal is received at the input of the amplifier 102. The signal is then amplified by a gain of +12 dB before being passed to the processing circuit 104.

The processing circuit 104 comprises a processing block 112 and a summing circuit 114. The processing block 112 is representative of a processing step carried out on the signal by the processing circuit 104 and the summing circuit 114 is representative of the addition of an error 116 to the signal as it passes through the processing circuit 104. The processing circuit 104 outputs the signal to the attenuation circuit 106 which attenuates the signal by a gain of −12 dB before providing the signal at the output of the attenuation circuit 106. The error 116 added to the signal as it passes through the processing circuit 104 is suppressed by 12 dB when referred to either the signal path input 108 or the signal path output 110.

FIG. 2 shows a DRE circuit 200 corresponding to an alternative schematic of the DRE system 100 shown in FIG. 1. Common features between FIGS. 1 and 2 share common reference numerals and variables. The amplifier circuit 102 receives a digital input signal d[n] at the signal path input 108. The amplifier circuit 106 applies a dynamic digital gain $g_d[n]$ to the digital input signal d[n]. The processing circuit 104 comprises a digital to analog converter (DAC) 202 for converting a digital signal to an analog signal.

The summing circuit 114 and the processing block 112 have been omitted in FIG. 2, however it will be appreciated that the DAC 202 incorporates these features, as the DAC 202 is susceptible to the error 116 and the DAC 202 provides a digital to analog conversion function, as may be represented by the processing block 112. For the processing circuit 104 comprising the DAC 202, the error 116 may, for example, result from random noise and/or supply interference.

The DAC 202 has an impulse response h[n]. The impulse response h[n] describes how the DAC 202 responds to receiving a signal over a short time frame. The attenuation circuit 106 applies a dynamic analog gain $g_a[n]$ and outputs an analog output signal a[n] at the signal path output 110.

The signal path of the DRE circuit 200 may be referred to as a D/A signal path as the inclusion of the DAC 202 means that an input digital signal is converted to an output analog signal.

The DRE circuit 200 also shows a model for the signal path, which can be represented mathematically as shown in equation (1). The analog output signal a[n] is as follows:

$$a[n]=((d[n] \cdot g_d[n])*h[n]) \cdot g_a[n] \quad (1)$$

where the symbols have their meanings as described previously. n is a time index and therefore equation (1) is in the time domain. The time index n has discrete values. Multiplication in the time domain of two time-varying sequences, namely the digital input signal d[n] and the digital gain $g_d[n]$, makes the DRE circuit 200 non-linear such that the DRE circuit 200 may result in undesirable behaviour. The DRE circuit 200 may even exhibit non-linear behaviour for a relatively small digital input signal d[n].

FIG. 3A and FIG. 3B show simulation results for the DRE circuit 200 of FIG. 2. The simulations were performed using parameters that are representative of a practical implementation of the DRE circuit 200.

FIG. 3A shows the dynamic digital gain $g_d[n]$ 300, and the dynamic analog gain $g_a[n]$ 302, as they vary with time. FIG. 3(b) shows the analog output signal a[n] 304 as it varies with time. Prior to a time t1, the gains $g_d[n]$ 300, $g_a[n]$ 302 are equal to one and the analog output signal a[n] 304 is equal to 0.25V.

It should be noted that the units associated with the x axis of FIG. 3A are seconds (s), and the units associated with the x axis of FIG. 3B are microseconds (μs).

At the time t1, the gain $g_d[n]$ 300 increases to 2 and the gain $g_a[n]$ 302 decreases to 0.5. Because the processing circuit 104 has a finite bandwidth, the gain change at the time t1 results in a transient output error in the analog output signal a[n] 304 that resembles a decaying impulse. The error is shown by the fall in the analog output signal a[n] 304 and its gradual rise as the analog output signal a[n] 304 decays back to its initial value.

It will be appreciated that if the processing circuit 104 was omitted, the gains $g_d[n]$, $g_a[n]$ would not introduce an error into the signal path.

FIG. 4 shows a trace 400 of the Fourier transform of the analog output signal a[n] 304 with no gain change applied and a trace 402 of the Fourier transform of the analog output signal a[n] with a gain change applied. The trace 402 shows the Fourier transform of the analog output signal a[n] when a 6 dB step is applied to the input signal d[n] by the amplifier circuit 102 and a corresponding −6 dB is applied by the amplifier circuit 106.

Since the Fourier transform of a decaying impulse is a low pass filter, the error is flat at low frequencies and rolls off at high frequencies, as can be observed by the trace 400. By "flat" it is meant that the error maintains a substantially constant value at low frequencies and by "rolls off" it is meant that error decreases at high frequencies as the frequency increases.

It will be appreciated that the low pass filter characteristics shown by the trace 400 are a result of the impulse response h[n] of the DAC 202 being a low pass filter, however other filter types may be used.

For audio applications of DRE, the flat response of the error at low frequencies means that the gain change may result in a highly undesirable audible click.

SUMMARY

It is desirable to provide an apparatus for dynamic range enhancement that can reduce errors during dynamic range enhancement gain changes when compared with the prior art.

According to a first aspect of the disclosure there is provided an apparatus for dynamic range enhancement (DRE) which receives an input signal and provides a DRE output signal, comprising an error correction circuit configured to apply an error correction factor to the input signal such that the DRE output signal provided by the apparatus is dependent on the input signal and the error correction factor, wherein the error correction factor is representative of an error generated by the apparatus.

Optionally, the apparatus comprises a DRE circuit, wherein the error correction circuit is configured to receive the input signal and to provide a corrected signal based on the input signal and the error correction factor, and the DRE circuit is configured to receive the corrected signal and to provide the DRE output signal based on the received corrected signal.

Optionally, the DRE circuit comprises an amplifier circuit configured to amplify the corrected signal, a processing circuit configured to receive the corrected signal from the amplifier circuit and to process the corrected signal, and an attenuation circuit configured to receive the corrected signal from the processing circuit, to attenuate the corrected signal and to provide the corrected signal as an output of the attenuation circuit, wherein the DRE output signal corresponds to the corrected signal output by the attenuation circuit.

Optionally, the processing circuit comprises a digital to analog converter (DAC) configured to receive the corrected signal from the amplifier circuit, wherein processing the corrected signal comprises converting the corrected signal from digital to analog using the DAC.

Optionally, the error correction circuit comprises a summing circuit configured to generate the corrected signal by adding or subtracting the error correction factor from the input signal, the corrected signal being provided at an output of the error correction circuit.

Optionally, the apparatus comprises a sigma delta modulator comprising the error correction circuit, wherein the sigma delta modulator is configured to reduce the resolution of the corrected signal prior to the corrected signal being received by the processing circuit.

Optionally, the sigma delta modulator comprises a loop filter, and a quantiser configured to reduce the resolution of the corrected signal prior to the corrected signal being received by the processing circuit, wherein the loop filter comprises a first input for receiving the corrected signal and an output coupled to the quantiser, and the quantiser has an output coupled to the processing circuit and a second input of the loop filter.

Optionally, the output of the quantiser is coupled to the processing circuit via the amplifier circuit.

Optionally, the loop filter is coupled to the quantiser via the amplifier circuit and the output of the quantiser is coupled to the second input the loop filter via a second amplifier circuit.

Optionally, the apparatus comprises a sigma delta modulator comprising the error correction circuit, wherein the sigma delta modulator is configured to reduce the resolution of the corrected signal prior to the corrected signal being received by the processing circuit.

Optionally, the error correction circuit comprises a loop filter comprising a first input for receiving the input signal, and a summing circuit comprising a first input for receiving the error correction factor and an output coupled to the second input of the loop filter, and the sigma delta modulator comprises a quantiser, wherein the loop filter comprises an output coupled to the quantiser, wherein the corrected signal is provided at the output of the loop filter, and the quantiser has an output coupled to the processing circuit and a second input of the summing circuit.

Optionally, the output of the quantiser is coupled to the processing circuit via the amplifier circuit.

Optionally, the loop filter is coupled to the quantiser via the amplifier circuit and the output of the quantiser is coupled to the second input of the loop filter via a second amplifier circuit.

Optionally, the apparatus comprises a memory element configured to store the error correction factor and to provide the error correction factor to the error correction circuit.

Optionally, the error correction factor is derived by calculating the error generated by the apparatus.

Optionally, the apparatus comprises an error correction factor generator configured to detect the error generated by the apparatus, to generate the error correction factor using the detected error, and to provide the error correction factor to error correction circuit.

Optionally, the apparatus comprises a DRE circuit comprising the error correction circuit, an amplifier circuit configured to amplify the input signal, a processing circuit configured to receive the input signal from the amplifier circuit and to process the input signal, and an attenuation circuit configured to receive the input signal from the processing circuit, to attenuate the input signal and to provide the input signal as an output of the attenuation circuit, wherein the DRE output signal corresponds to the input signal output by the attenuation circuit, and the input signal is adjusted by the error correction circuit based on the error correction factor prior to being output by the attenuation circuit as the DRE output signal.

Optionally, the attenuation circuit comprises the error correction circuit, and the error correction circuit is configured to adjust the attenuation applied by the attenuation circuit based on the received error correction factor.

Optionally, the error generated by the apparatus results from at least one of a gain change or a delay.

Optionally, the error correction circuit is configured to receive the error correction factor.

According to a second aspect of the disclosure there is provided a method of dynamic range enhancement (DRE) using an apparatus comprising an error correction circuit, the method comprising receiving an input signal at the apparatus, applying an error correction factor to the input signal using the error correction circuit, and providing a DRE output signal, wherein the DRE output signal provided by the apparatus is dependent on the input signal and the error correction factor, and the error correction factor is representative of an error generated by the apparatus.

It will be appreciated that the method of the second aspect may include providing and/or using the features set out in the first aspects and can incorporate other features as described herein.

BRIEF DESCRIPTION OF THE DRAWINGS

The disclosure is described in further detail below by way of example and which reference to the accompanying drawings in which:

FIG. 3A shows simulation results of the dynamic gains of the DRE circuit of FIG. 2, and FIG. 3B show simulations results of the analog output signal of the DRE circuit of FIG. 2;

DESCRIPTION

Figure 1:
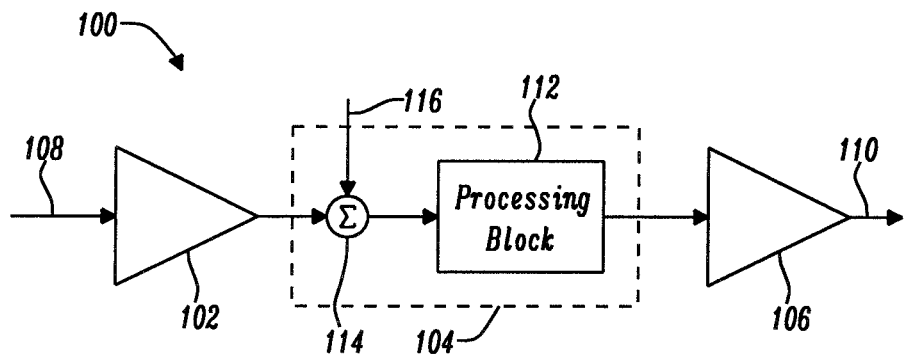
FIG. 1 is a schematic of a DRE system.
Figure 2:
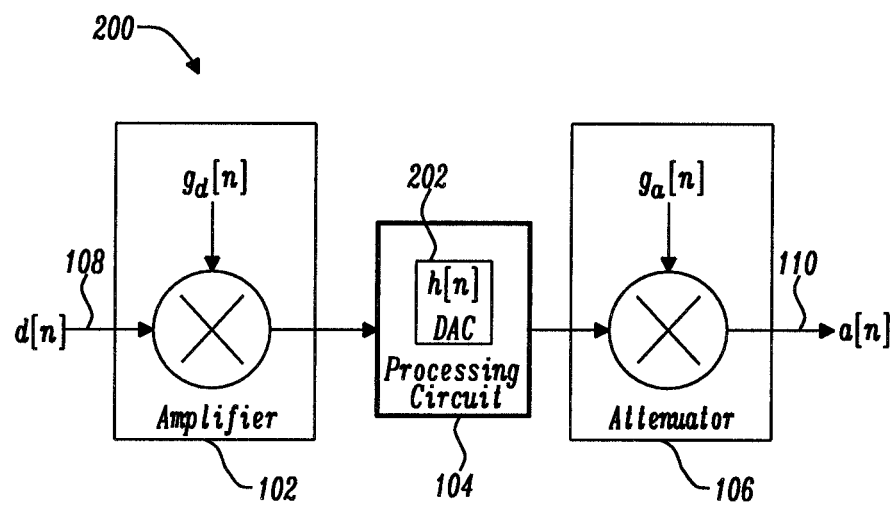
FIG. 2 is a schematic of a DRE circuit, corresponding to an alternative schematic of the DRE system of FIG. 1.
Figure 4:
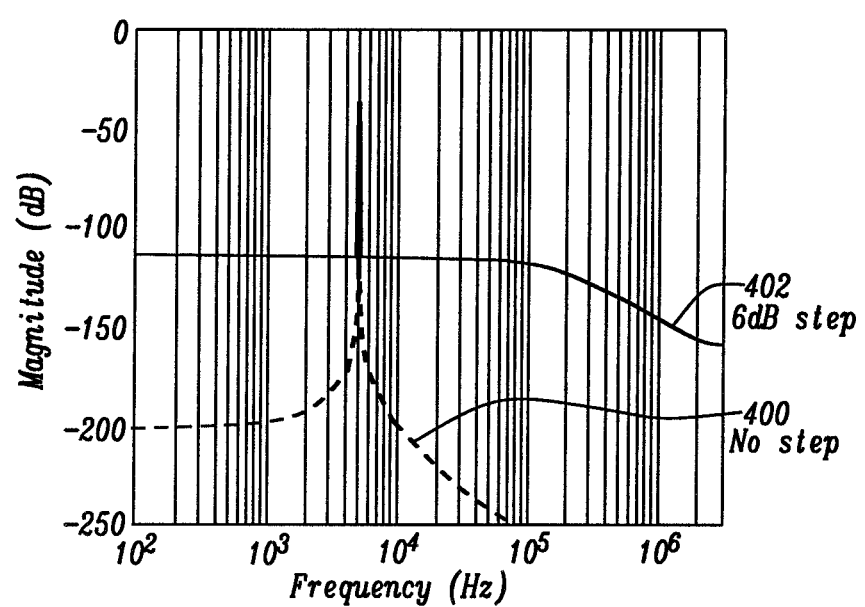
FIG. 4 is a graph of the Fourier transform of the analog output signal shown in FIG. 3B with and without a gain change applied.

The error 116 described for FIG. 1 is reduced through the inclusion of a dynamic range enhancement (DRE) circuit, for example of the type shown in FIG. 2. The present disclosure provides an apparatus that can reduce errors that arise due to the inclusion of the DRE circuit itself. In particular, the disclosure relates to the reduction of errors that arise due to the gain change associated with the DRE circuit.

Figure 5A:
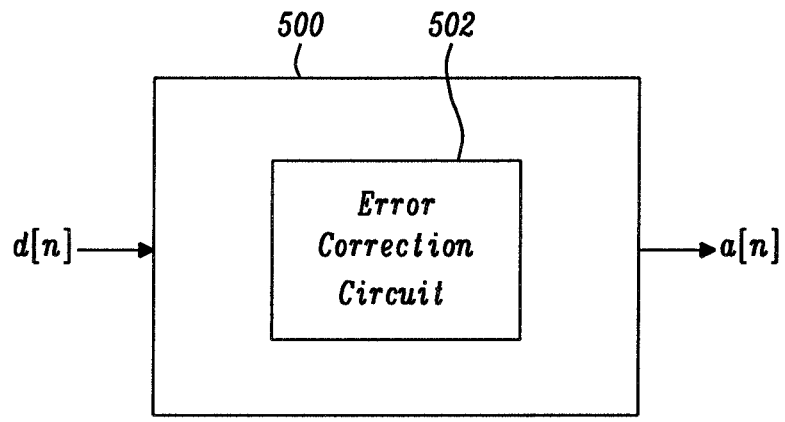
FIG. 5A is a schematic of an apparatus in accordance with a first embodiment of the present disclosure.

FIG. 5A shows an apparatus 500 for dynamic range enhancement (DRE) in accordance with a first embodiment of this disclosure. The apparatus 500 is configured to receive an input signal d[n] and provides a DRE output signal a[n].

The apparatus 500 comprises an error correction circuit 502. The error correction circuit 502 is configured to apply an error correction factor $d_e[n]$ to the input signal d[n] such that the DRE output signal a[n] provided by the apparatus 500 is dependent on the input signal d[n] and the error correction factor $d_e[n]$. The error correction factor $d_e[n]$ is representative of an error generated by the apparatus 500.

Figure 5B:
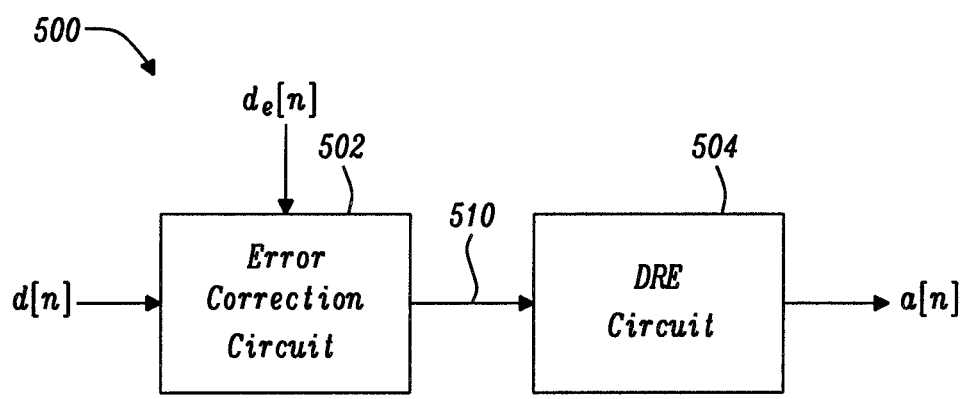
FIG. 5B is a schematic of an apparatus in accordance with a second embodiment of the present disclosure.

FIG. 5B shows an embodiment of the apparatus 500 for dynamic range enhancement (DRE) as shown in FIG. 5A in accordance with a second embodiment of this disclosure. The apparatus 500 is configured to receive an input signal d[n] and to provide a DRE output signal a[n].

The apparatus 500 comprises the error correction circuit 502 and a DRE circuit 504.

The error correction circuit 502 is configured to receive the input signal d[n] and the error correction factor $d_e[n]$, and to provide a corrected signal 510 that is based on the input signal d[n] and the error correction factor $d_e[n]$. The DRE circuit 504 is configured to receive the corrected signal 510 and to provide the DRE output signal a[n] based on the received corrected signal 510. The error correction factor $d_e[n]$ is representative of an error generated by apparatus 500, and in particular is representative of the error generated by the DRE circuit 504.

The term "error correction signal $d_e[n]$" may be used to refer to the error correction factor $d_e[n]$ when the error correction factor $d_e[n]$ is received by the error correction circuit 502.

The signal path is formed from an input of the error correction circuit 502 that receives the input signal d[n] to an output of the DRE circuit 504 that provides the DRE output signal a[n].

The input signal d[n] may correspond to the digital input signal d[n] as described for FIG. 2 and the DRE output signal a[n] may correspond to the analog output signal a[n] as described for FIG. 2.

The error correction circuit 502 enables the error incurred due to the gain change of the DRE circuit 504 to be substantially removed from the signal path of the apparatus 500. The error correction signal $d_e[n]$ may be representative of the error incurred due to the gain change of the DRE circuit 504.

The error correction signal $d_e[n]$ may be derived by calculating the error generated by the apparatus 500, and in particular by calculating the error generated by the DRE circuit 504, for example by calculating the error that is expected from the gain change of the DRE circuit 504. The expected error may be calculated by considering the circuit components of the DRE circuit 504. Alternatively, the error correction signal $d_e[n]$ may simply be estimated without any detailed derivation of the expected error.

Figure 5C:
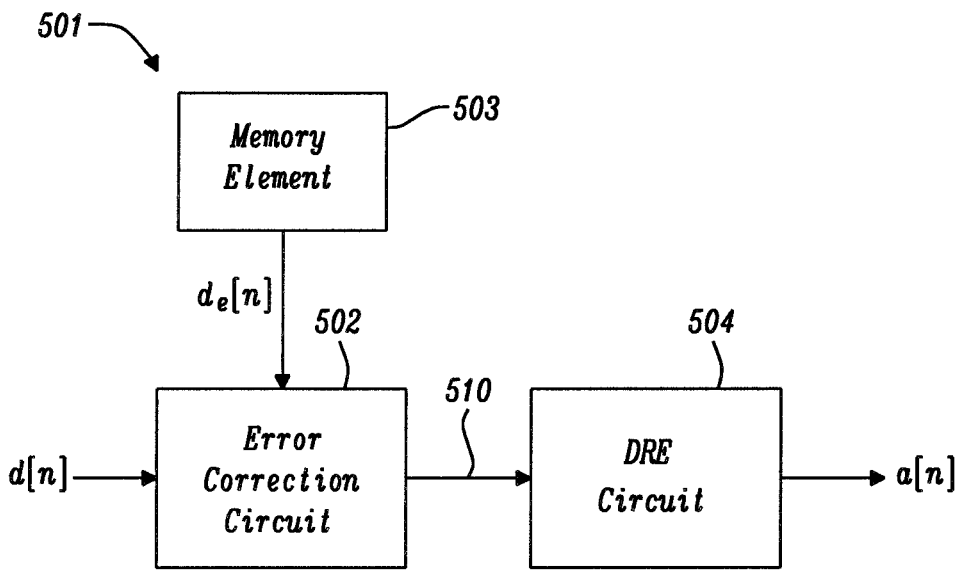
FIG. 5C is a schematic of an apparatus in accordance with a third embodiment of the present disclosure.

FIG. 5C shows an apparatus 501 in accordance with a third embodiment of this disclosure. The apparatus 501 corresponds to the apparatus 500, however in this specific embodiment the apparatus 501 comprises a memory element 503 configured to store the error correction signal $d_e[n]$ and to provide the error correction signal $d_e[n]$ to the error correction circuit 502. Common features between different Figures are represented by common reference numerals and common variables.

Figure 5D:
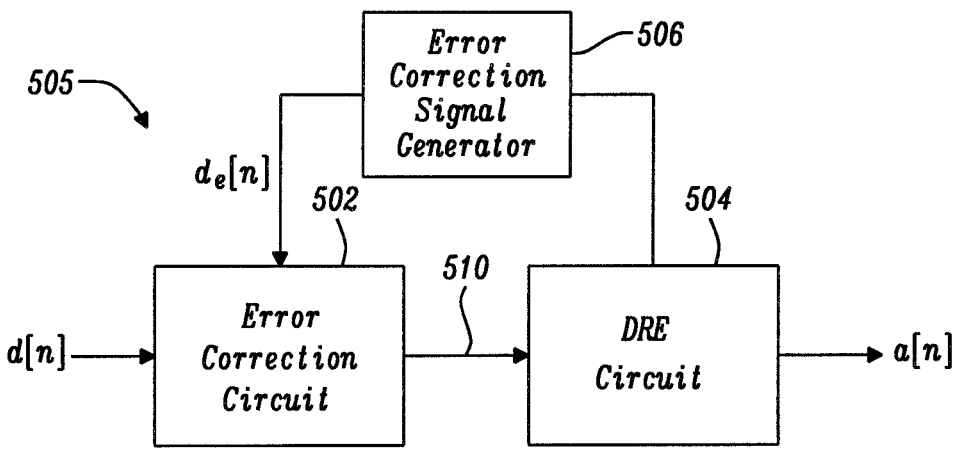
FIG. 5D is a schematic of an apparatus in accordance with a fourth embodiment of the present disclosure.

FIG. 5D shows an apparatus 505 in accordance with a fourth embodiment of this disclosure. The apparatus 505 corresponds to the apparatus 500, however in this specific embodiment the apparatus 505 comprises an error correction signal generator 506. A feedback loop is formed from the DRE circuit 504 to the error correction circuit 502 via the error correction signal generator 506. Using the error correction signal generator 506, the error correction signal $d_e[n]$ may be derived during operation of the DRE circuit 504. The error correction signal generator 506 is configured to detect the error generated by the apparatus 500 (in particular, the error generated by the DRE circuit 504) and to generate a suitable error correction signal $d_e[n]$ using the detected error. The error correction signal generator 506 then provides the error correction signal $d_e[n]$ to the error correction circuit 502. Common features between different Figures are represented by common reference numerals and common variables.

It will be appreciated that there are other methods to determine the error correction signal $d_e[n]$ in accordance with the understanding of the skilled person.

Figure 6A:
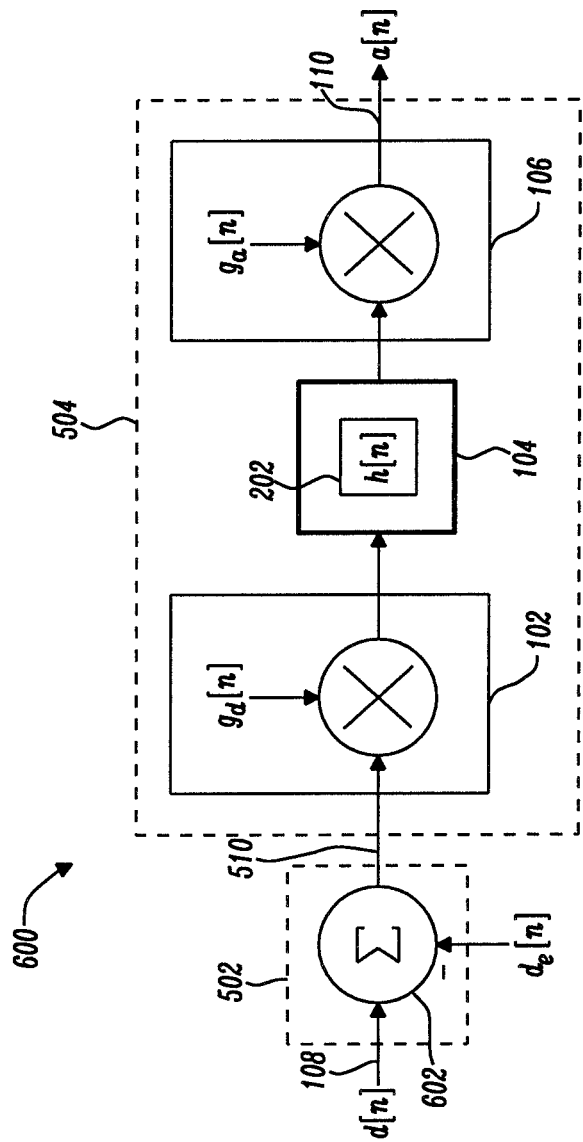
FIG. 6A is a schematic of an apparatus in accordance with a fifth embodiment of the present disclosure.

FIG. 6A shows an apparatus 600 in accordance with a fifth embodiment of this disclosure. The apparatus 600 corresponds to the apparatus 500 but with specific implementations of the error correction circuit 502 and the DRE circuit 504. The specific implementations share features with DRE system 100 and the DRE circuit 200. Common features between different Figures are represented by common reference numerals and common variables.

The input signal d[n] is adjusted by the error correction circuit 502, based on the error correction signal $d_e[n]$, to provide the corrected signal 510. Specifically, the error correction circuit 502 comprises a summing circuit 602 that is configured to generate the corrected signal 510 by adding or subtracting the error correction signal $d_e[n]$ from the input signal d[n]. The corrected signal 510 generated by the error correction circuit 502 is provided at an output of the error correction circuit 502 to the DRE circuit 504. In the present embodiment the corrected signal 510 is generated by subtracting the error correction signal $d_e[n]$ from the input signal d[n].

The DRE circuit 504 comprises the amplifier circuit 102, the processing circuit 104 which comprises the DAC 202, and the attenuation circuit 106. The amplifier circuit 102 is configured to amplify the corrected signal 510 by the dynamic digital gain $g_d[n]$. The amplifier circuit 102 receives the corrected signal 510 from the error correction circuit 502.

The processing circuit 104 is configured to receive the corrected signal 510 from the amplifier circuit 102 and to process the corrected signal 510. In this specific embodiment, the DAC 202 is configured to receive the corrected signal 510 from the amplifier circuit 102 and the processing of the corrected signal 510 comprises converting the corrected signal 510 from digital to analog using the DAC 202. The attenuation circuit 106 is configured to receive the corrected signal 510 from the processing circuit 104, to attenuate the corrected signal 510 by the dynamic analog gain $g_a[n]$, and to provide the corrected signal 510 as an output of the attenuation circuit 106. In this specific embodiment, the attenuation circuit 106 is configured to receive the corrected signal 510 from the DAC 202. The DRE output signal a[n] corresponds to the corrected signal 510 output by the attenuation circuit 106.

The apparatus 600 also shows a model for the signal path, which can be represented mathematically, and with reference to the relevant transfer functions, as shown in equation (2). The DRE output signal a[n] is as follows:

$$a[n]=(((d[n]-d_e[n]) \cdot g_d[n]) \cdot h[n]) \cdot g_a[n] \quad (2)$$

From equation (2) it is possible to derive an error correction signal $d_e[n]$ that corresponds to the error generated during the gain change. The error correction signal $d_e[n]$ can then be referred to the input of the signal path as a digital signal to compensate for the error incurred during the gain change. In the apparatus 600, the error correction signal $d_e[n]$ represents the input-referred, time-varying error sequence. Subtracting the error correction signal $d_e[n]$ at the input of the signal path can reduce, and may substantially eliminate, the error from the DRE output signal a[n]. In this specific embodiment, the error correction signal $d_e[n]$ is subtracted from the input signal d[n] using the summing circuit 602. The corrected signal 510 output by the summing circuit 602 therefore corresponds to the input signal d[n] minus the error correction signal $d_e[n]$.

An ideal DRE output signal a[n] is given by equation (3):

$$a[n]=d[n]*h[n] \quad (3)$$

The ideal DRE output signal a[n] is the DRE output signal a[n] in the event that no gain change occurs.

The error correction signal $d_e[n]$ may be derived by combining equations (2) and (3), and is given by equation (4):

$$d_e[n] = d[n] - \left( \frac{(d[n]*h[n])}{g_a[n]} * h^{-1}[n] \right) \frac{1}{g_d[n]} \quad (4)$$

Therefore, by providing an error correction signal $d_e[n]$ to the error correction circuit 502, as derived using equation (4), it is possible to reduce the error resulting from a gain change in the signal path and therefore it is possible to reduce the error on the DRE output signal a[n].

It will be appreciated that the processing circuit 104 of the embodiments presented in this disclosure may alternatively comprise a circuit component, element or device that has an impulse response h[n], other than the DAC 202, in accordance with the understanding of the skilled person. For example, the processing circuit 104 may comprise an analog to digital converter (ADC).

Figure 6B:
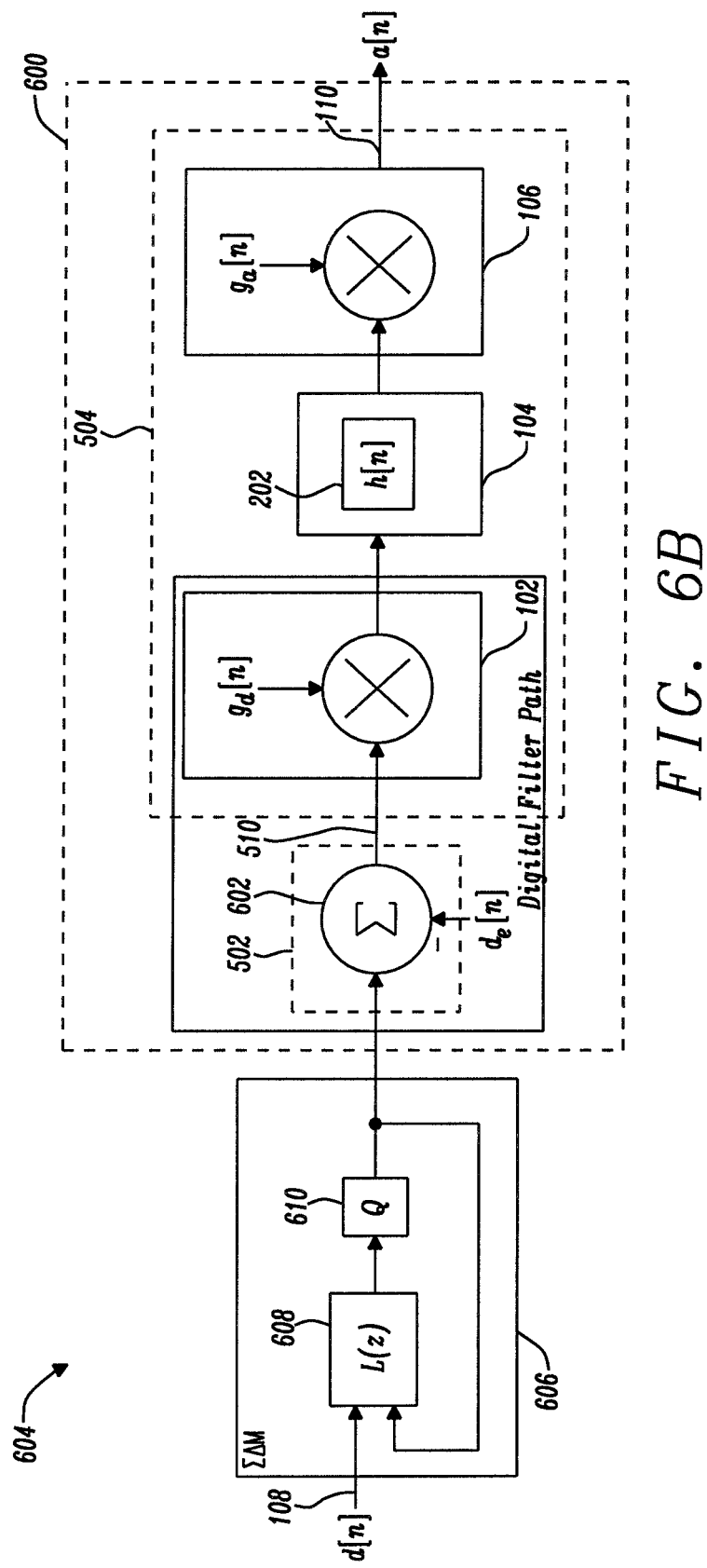
FIG. 6B is a schematic of an apparatus in accordance with a sixth embodiment of the present disclosure.

FIG. 6B shows an apparatus 604 in accordance with a sixth embodiment of this disclosure. The apparatus 604 comprises the apparatus 600 and a sigma delta modulator 606. The sigma delta modulator 606 comprises a loop filter 608 and a quantiser 610. Common features between different Figures are represented by common reference numerals and common variables. The sigma delta modulator 606 is configured to reduce the resolution of the input signal d[n] prior to the input signal d[n] being received by the processing circuit 104.

The loop filter 608 comprises a first input corresponding to the signal path input 108. The first input of the loop filter 608 is configured to receive the input signal d[n]. The loop filter 608 comprises an output coupled to the quantiser 610. The quantiser 610 has an output coupled to the processing circuit 104 and a second input of the loop filter 608. The output of the quantiser 610 is coupled to the processing circuit 104 via the error correction circuit 502 and the amplifier circuit 102.

The quantiser 610 is configured to reduce the resolution of the input signal d[n] prior to the input signal d[n] being received by the processing circuit 104.

In operation, the quantiser 610 receives the input signal d[n], after it is filtered through the loop filter 608 and converts the input signal d[n] from a medium-to-high resolution digital signal, to a low resolution digital signal.

Reducing the resolution of the input signal d[n] enables easier processing of the corrected signal 510 by the DAC 202. However, the decrease in resolution of the input signal d[n] results in the generation of an error, known as quantisation noise.

The loop filter 608 operates on the difference between the signals received at its inputs, namely the input signal d[n] received at the first input and the low resolution digital signal output by the quantiser 610, The low resolution digital signal output by the quantiser 610 corresponds to the input signal d[n] after having passed through the loop filter 608 and the quantiser 610.

The loop filter 608 operates on the difference between the input signal d[n] and the low resolution digital signal in such a way that the quantisation noise from the quantiser 610 is shaped out of band in accordance with standard sigma delta modulator operating principles, as will be clear to the person skilled in the art.

The spectral manipulation of quantisation noise by the loop filter 608 using this method is often referred to as "noise shaping." The quantisation noise at low frequencies is substantially removed, as is desirable, and the quantisation noise at higher frequencies may simply be filtered out. The noise shaping features of sigma delta modulators mean that they are particularly useful in low-bandwidth applications, such as in audio applications.

Figure 6C:
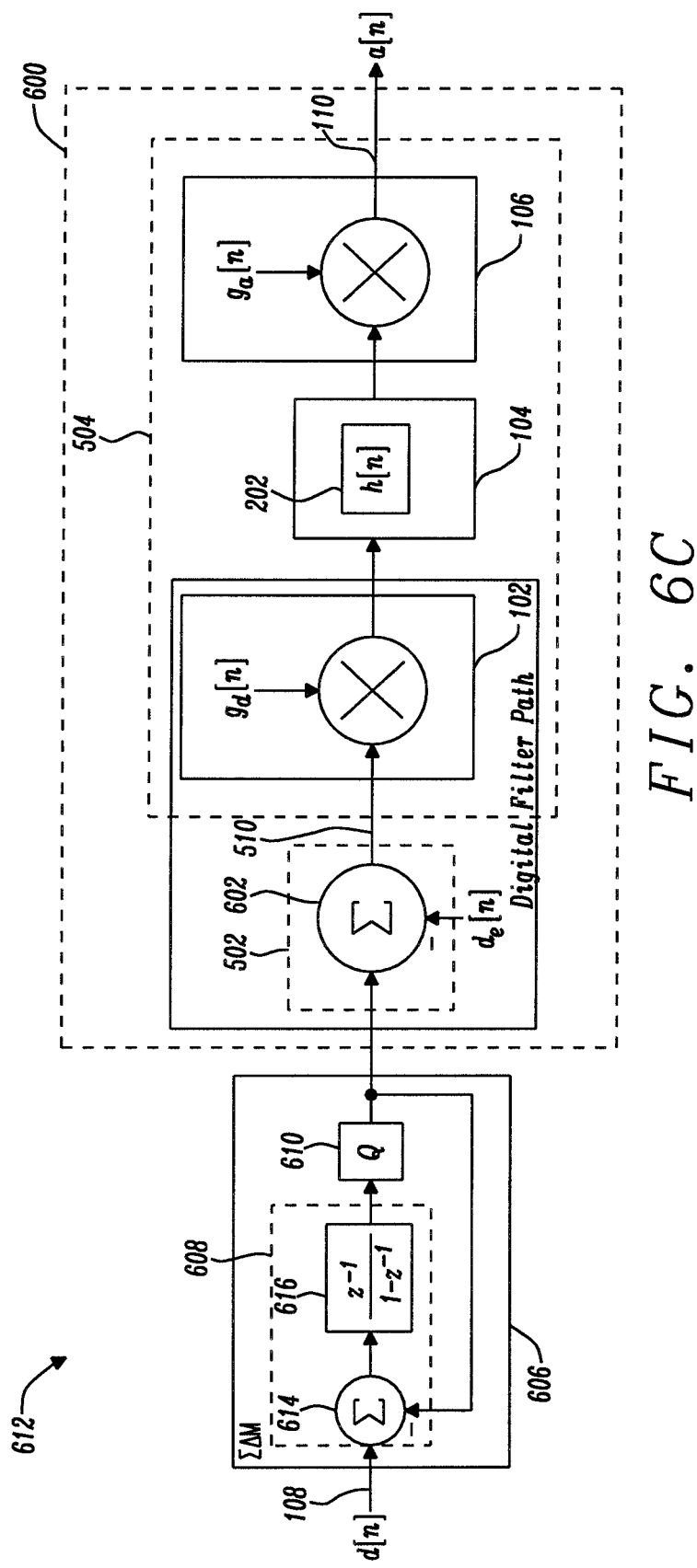
FIG. 6C is a schematic of an apparatus in accordance with a seventh embodiment of the present disclosure.

FIG. 6C shows an apparatus 612 in accordance with a seventh embodiment of this disclosure. The apparatus 612 comprises the apparatus 604, with a specific implementation of the loop filter 608 shown. Common features between different Figures are represented by common reference numerals and common variables.

The loop filter 608 comprises a summing circuit 614 configured to subtract the output of the quantiser 608 (the low resolution digital signal) from the input signal d[n]. The loop filter 608 further comprises an integrator circuit 616 that is configured to operate on the difference between the input signal d[n] and the low resolution digital signal in such a way that the quantisation noise from the quantiser 608 is shaped out of band, as discussed previously.

It will be appreciated that other loop filter 608 implementations are available for sigma delta modulators which include, but are not limited to, multiple feedforward paths, multiple feedback paths, multiple integrators, and multiple modulators (as in MASH structures), in accordance with the understanding of the skilled person.

Figure 7A:
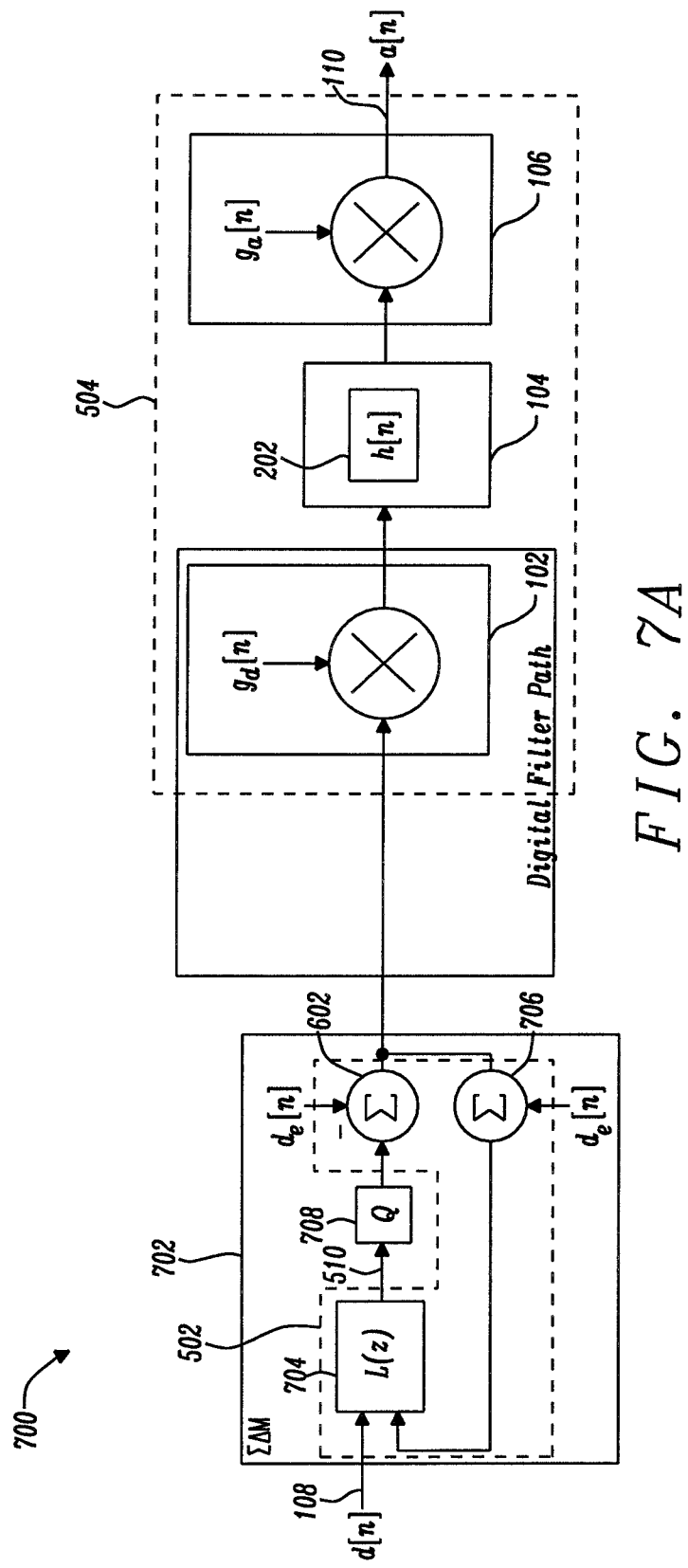
FIG. 7A is a schematic of an apparatus in accordance with an eighth embodiment of the present disclosure.

FIG. 7A shows an apparatus 700 in accordance with an eighth embodiment of this disclosure. The apparatus 700 corresponds to the apparatus 500 but with specific implementations of the error correction circuit 502 and the DRE circuit 504. The specific implementations share features with DRE system 100 and the DRE circuit 200. Common features between different Figures are represented by common reference numerals and common variables.

The apparatus 700 comprises a sigma delta modulator 702. The sigma delta modulator 702 comprises the error correction circuit 502. The sigma delta modulator 702 is configured to reduce the resolution of the corrected signal 510 prior to the corrected signal 510 being received by the processing circuit 104.

In this specific embodiment, the error correction circuit 502 comprises a loop filter 704, a summing circuit 706 and the summing circuit 602. The loop filter 704 comprises a first input corresponding to the signal path input 108. The first input of the loop filter 704 is configured to receive the input signal d[n]. The summing circuit 706 comprises a first input for receiving the error correction signal $d_e[n]$ and an output coupled to a second input of the loop filter 704.

In this specific embodiment, the summing circuit 706 is configured to add the signal received from a quantiser 708 to the error correction signal $d_e[n]$ and provide the resultant signal to the second input of the loop filter 704. Alternatively, in a further embodiment, the summing circuit 706 may be configured to subtract the error correction signal $d_e[n]$ from the signal received from the quantiser 708 in accordance with the understanding of the skilled person.

The sigma delta modulator 702 comprises the quantiser 708. The loop filter 704 comprises an output coupled to the quantiser 708. The corrected signal 510 is provided at the output of the loop filter 704.

The quantiser 708 has an output coupled to the processing circuit 104 via the amplifier circuit 102 and the summing circuit 602. The output of the quantiser 608 is coupled to the second input of the summing circuit 706 via the summing circuit 602. The summing circuit 602 subtracts the error correction signal $d_e[n]$ from the signal received from the output of the quantiser 708.

The quantiser 708 is configured to reduce the resolution of the corrected signal 510 prior to the corrected signal 510 being received by the processing circuit 104.

It will be appreciated that the apparatus 700 is mathematically equivalent to the apparatus 604, as the summing circuit 602 has merely be moved within the feedback loop formed from the quantiser 708 to the second input of the loop filter 704, with the further summing circuit 706 being used to remove the error correction signal $d_e[n]$ from the feedback loop prior to being received by the loop filter 704.

It will be appreciated that the summing circuits 602, 706 may be located in another part of the apparatus 700 in accordance with the understanding of the skilled person.

As described previously for the apparatus 600, by providing an error correction signal $d_e[n]$ to the error correction circuit 502 of the apparatus 700, as derived using equation (4), it is possible to reduce the error resulting from a gain change in the signal path and therefore it is possible to reduce the error on the DRE output signal a[n].

Figure 7B:
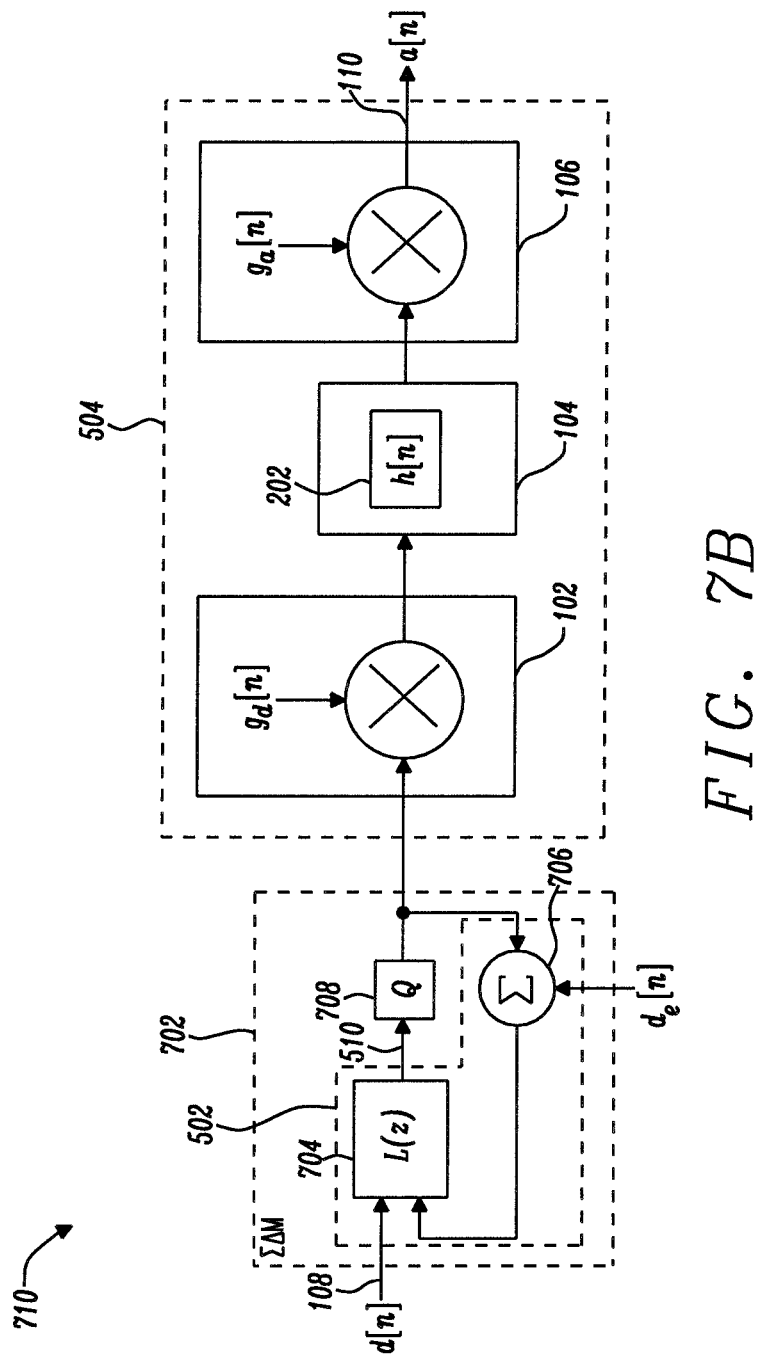
FIG. 7B is a schematic of an apparatus in accordance with a ninth embodiment of the present disclosure.

FIG. 7B shows an apparatus 710 in accordance with an ninth embodiment of this disclosure. The apparatus 710 corresponds to the apparatus 700 but with the error correction term as part of the feedforward path of the sigma delta modulator 200 removed, as seen by the removal of the summing circuit 602. Common features between different Figures are represented by common reference numerals and common variables.

For a D/A signal path comprising a sigma delta modulator, the input signal d[n] may be a high-speed, low resolution digital signal. In this case, subtracting a high resolution error correction signal $d_e[n]$ from the signal output by the quantiser 610, 708, for example as shown in the apparatuses 600, 700, may be difficult and can result in further error in the signal path.

To resolve this issue, the summing circuit 602 is removed, such that subtraction of the error correction signal $d_e[n]$ from the feedforward path of 700 is removed. Removal of the summing circuit 602 results in an additional error relative to the other apparatuses, however this additional error will be "shaped" by the sigma delta modulator 702 and its feedback loop comprising the loop filter 704, as part of the noise shaping process as discussed previously.

For common sigma delta modulator designs, the additional error arising due to the removal of the summing circuit 602 will be negligible compared to the quantisation noise introduced by the quantiser 708.

In operation, the quantiser 708 receives the corrected signal 510 and converts the corrected signal 510 from a medium-to-high resolution digital signal, to a low resolution digital signal. Reducing the resolution of the corrected signal 510 enables easier processing of the corrected signal 510 by the DAC 202. However, the decrease in resolution of the corrected signal 510 results in the generation of an error, known as quantisation noise.

Figure 8:
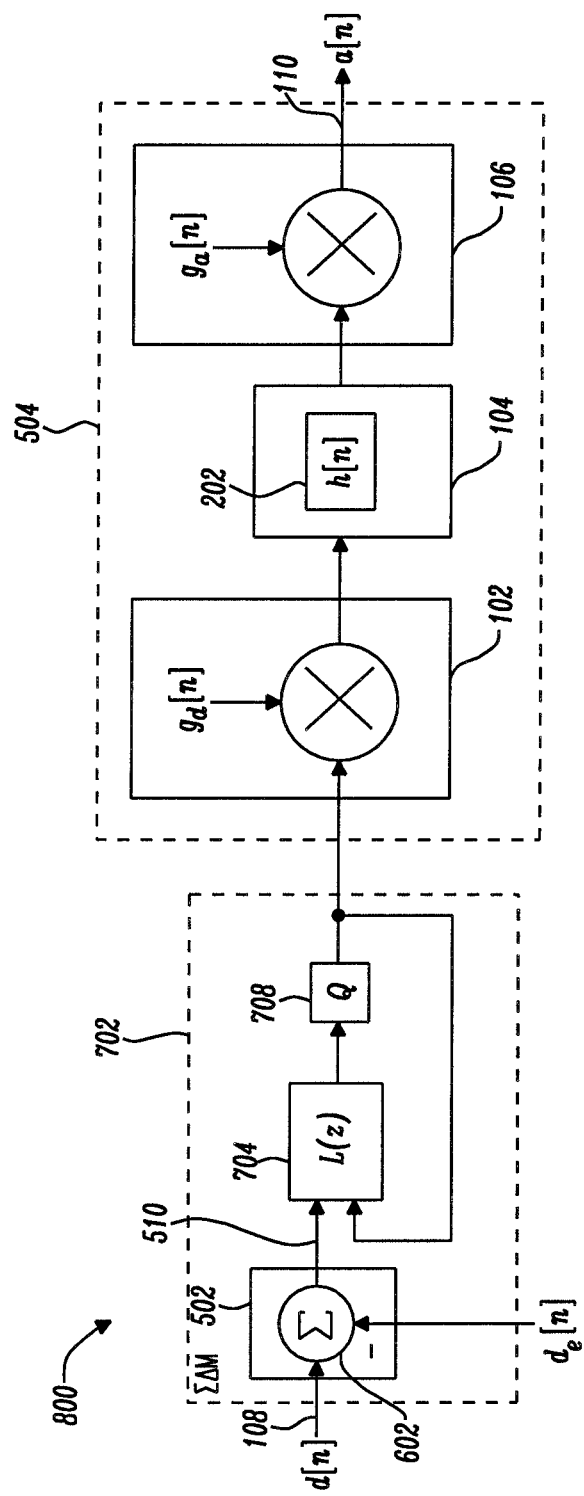
FIG. 8 is a schematic of an apparatus in accordance with a tenth embodiment of the present disclosure.

FIG. 8 shows an apparatus 800 in accordance with a tenth embodiment of this disclosure. The apparatus 800 corresponds to the apparatus 500 but with specific implementations of the error correction circuit 502 and the DRE circuit 504. The specific implementations share features with DRE system 100, the DRE circuit 200, the apparatus 600 and the apparatus 710. Common features between different Figures are represented by common reference numerals and common variables.

The apparatus 800, comprises the sigma delta modulator 702. The sigma delta modulator 702 comprises the error correction circuit 502. The sigma delta modulator 702 is configured to reduce the resolution of the corrected signal 510 prior to the corrected signal 510 being received by the processing circuit 104, as discussed for the quantiser 708 for the apparatus 710.

The sigma delta modulator 702 comprises the loop filter 704 and the quantiser 708. The loop filter 704 comprises a first input for receiving the corrected signal 510 from the summing circuit 602; and the loop filter 704 comprises an output coupled to the quantiser 708. The quantiser 708 has an output coupled to the processing circuit 104 and a second input of the loop filter 704. The output of the quantiser 708 is coupled to the processing circuit 104 via the amplifier circuit 102.

For the purposes of deriving the error correction signals $d_e[n]$, the transfer function of the sigma delta modulator, specifically the signal transfer function (STF), is preferably accounted for in the impulse response h[n] in equation (4).

Figure 9:
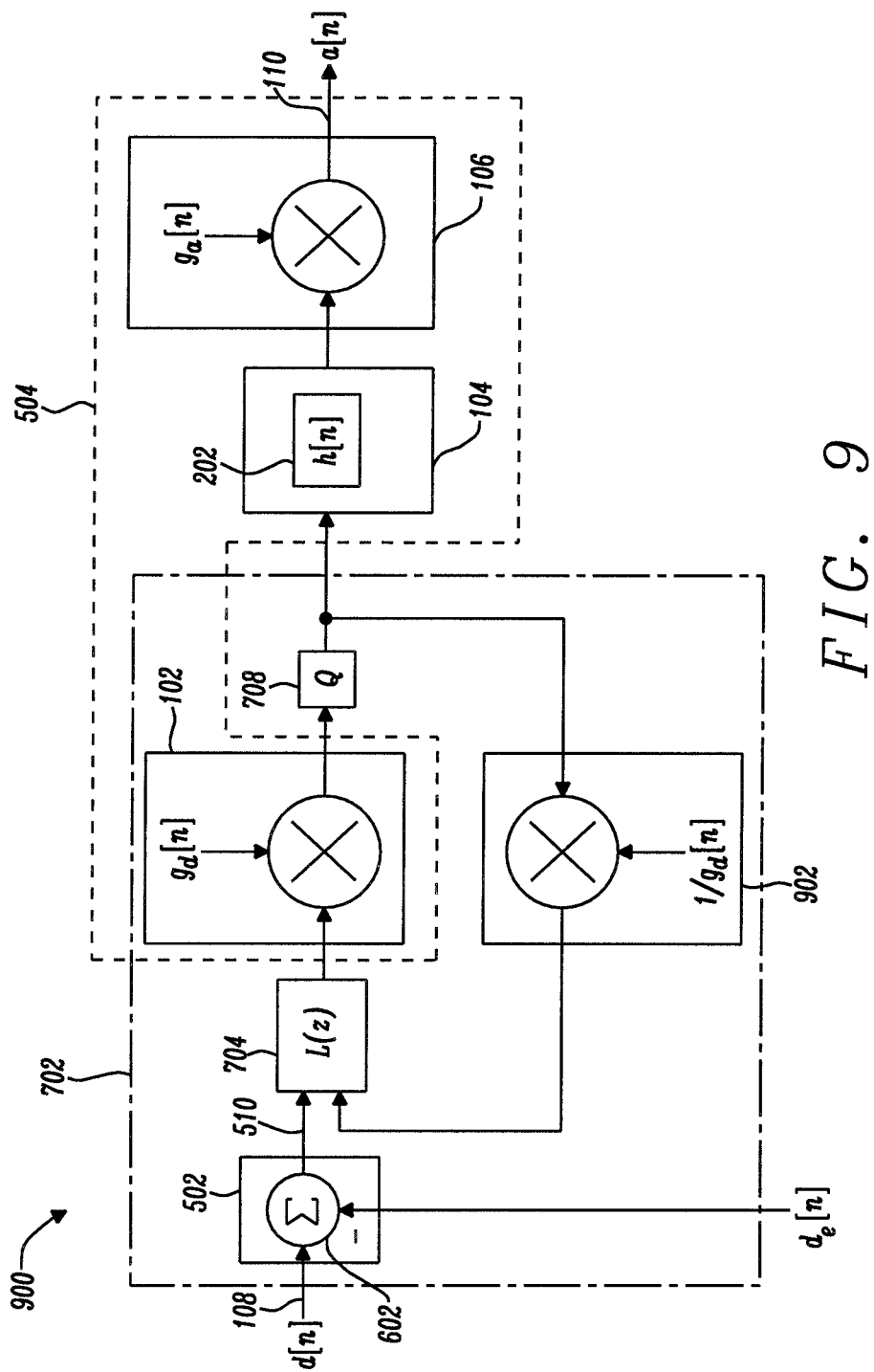
FIG. 9 is a schematic of an apparatus in accordance with an eleventh embodiment of the present disclosure.

FIG. 9 shows an apparatus 900 in accordance with an eleventh embodiment of this disclosure. The apparatus 900 corresponds to the apparatus 500 but with specific implementations of the error correction circuit 502 and the DRE circuit 504. The specific implementations share features with DRE system 100, the DRE circuit 200, the apparatus 600 and the apparatus 710. Common features between different Figures are represented by common reference numerals and common variables.

In this specific embodiment, the loop filter 704 is coupled to the quantiser 708 via the amplifier circuit 102. The output of the quantiser 708 is coupled to the second input of the loop filter 704 via an amplifier circuit 902. The amplifier circuit 902 may have a gain equal to $1/g_d[n]$, where $g_d[n]$ is the gain of the amplifier circuit 102.

Figure 10:
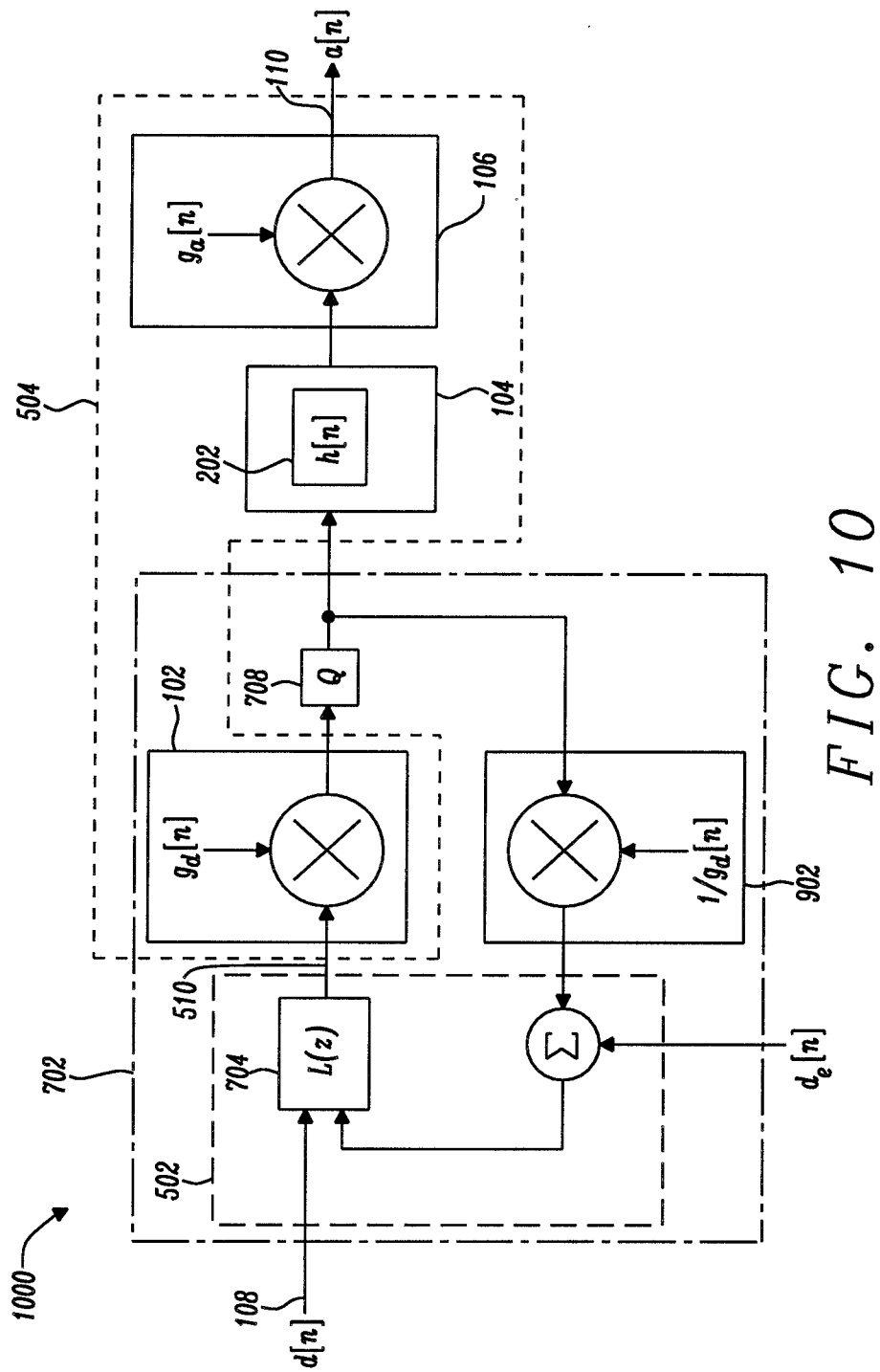
FIG. 10 is a schematic of an apparatus in accordance with a twelfth embodiment of the present disclosure.

FIG. 10 shows an apparatus 1000 in accordance with a twelfth embodiment of this disclosure. The apparatus 1000 corresponds to the apparatus 500 but with specific implementations of the error correction circuit 502 and the DRE circuit 504. The specific implementations share features with DRE system 100, the DRE circuit 200, the apparatus 600, the apparatus 710 and the apparatus 900. Common features between different Figures are represented by common reference numerals and common variables.

In this specific embodiment, the loop filter 704 is coupled to the quantiser 708 via the amplifier circuit 102. The output of the quantiser 708 is coupled to the second input of the loop filter via the amplifier circuit 902.

The DAC 202 may function as a filter having an infinite impulse response (IIR) or finite impulse response (FIR). An IIR means that the impulse response h[n] does not reduce to zero after a sufficiently long time period, whereas a FIR means that the impulse response h[n] does reduce to zero after a sufficiently long time period. The DAC 202 can take on an IIR response or a FIR response if discrete-time modelled, or an IIR response if continuous-time modelled. The present disclosure may be applied to a DAC 202 having an IIR response or a FIR response. It will be appreciated that the present disclosure may be applied to any suitable circuit component, element or device that can be modelled as having an IIR response or a FIR response.

The appropriate error correction signal $d_e[n]$ to reduce the error arising due to the gain change for a DAC 202 functioning as an IIR filter may be derived as follows.

An example IIR filter with impulse response, h[n], has a transfer function, H(z), given by equation (5). In this section z is the well-known variable representing the discrete-time frequency domain, and α is a function of the IIR filter pole frequency. Square brackets are used to indicate time indices, and parentheses are used to indicate frequency indices.

$$H(z) = \frac{1-\alpha}{1-\alpha z^{-1}} \quad (5)$$

Using equation (5), an output y[n] of the IIR filter, for an input x[n], can be derived as equation (6).

$$y[n] = (1-\alpha) \times [n] + \alpha y[n-1] \quad (6)$$

The inverse of equations (5) and (6), are given by equations (7) and (8), respectively. Equation (8) is necessary for the derivation of a suitable error correction signal $d_e[n]$ as described previously with respect to equation (4).

$$H^{-1}(z) = \frac{1 - \alpha z^{-1}}{1 - \alpha} \quad (7)$$

$$y[n] = \frac{1}{1-\alpha}x[n] - \frac{\alpha}{1-\alpha}x[n-1] \quad (8)$$

The gains $g_d[n]$, $g_a[n]$ are modelled as changing from a first gain $G_1$ to a second gain $G_2$ when the time index n is equal to zero and with inverse magnitude step sizes with respect to each other, as shown by equations (9) and (10).

$$g_d[n] = \begin{cases} G_1, n < 0 \\ G_2, n \geq 0 \end{cases} \quad (9)$$

$$g_a[n] = \begin{cases} \frac{1}{G_1}, n < 0 \\ \frac{1}{G_2}, n \geq 0 \end{cases} \quad (10)$$

The dynamic digital gain $g_d[n]$ is equal to the first gain $G_1$ when the time index n is less than zero and the dynamic digital gain $g_d[n]$ is equal to the second digital gain $G_2$ when the time index n is greater than or equal to zero. The dynamic analog gain $g_a[n]$ is equal to one over the first gain $G_1$ when the time index n is less than zero and the dynamic analog gain $g_a[n]$ is equal to one over the second digital gain $G_2$ when the time index n is greater than or equal to zero.

With regards to equation (4), for the time index n being less than zero (n<0), the gains $g_d[n]$, $g_a[n]$ are both unity as the first gain $G_1$ is equal to one. The gains $g_d[n]$, $g_a[n]$ are modelled as being equal to one since the beginning of time. For the time index n being less than zero the input signal d[n] is simply passed through both the impulse response h[n] and its inverse $h^{-1}[n]$, and the error correction signal $d_e[n]$ is equal to zero.

With regards to equation (4), for the time index n being much greater than zero (n>>0), the gain change has settled out such that $d_e[n]$ is also equal to zero.

With regards to equation (4), for the time index n being equal to zero (n=0), the error correction signal $d_e[n]$ is given by equation (11) as follows:

$$d_e[0] = -\left(1 - \frac{G_1}{G_2}\right)\frac{\alpha}{1-\alpha}(d*h)[-1] \qquad (11)$$

The inverse of the impulse response, $h^{-1}[n]$, is a first-order difference in this example meaning only the terms at n=−1 and n=−2 from (d*h) [n], $g_a[n]$ and $g_d[n]$ contribute to equation (11). Therefore, when the time index n=1, the history of the gain change is no longer a concern and $d_e[1]$=0; this means that for a single-pole IIR response only a single term is needed to correct for the effects of the gain change: $d_e[0]$, as given by equation (11).

Providing the error correction signal $d_e[0]$, given by equation (11) to the error correction circuit 502 of any of the embodiments of this disclosure will substantially cancel the effects of the gain change resulting from DRE, provided the impulse response h[n] of the DAC 202 and the gain changes match those used for the IIR filter analysis outlined using equations (5)-(11).

Provided the DAC IIR coefficients are optimised in accordance with the above discussion, a digital multiplier is not needed. Therefore, there may be a reduction in power requirements and costs when compared to prior art circuits.

The above analysis for an IIR filter has been performed for the impulse response h[n], where the impulse response h[n] is a transfer function having a single pole. It will be appreciated that the analysis can be repeated for an arbitrary transfer function with any number of poles. The resulting error correction signal $d_e[n]$ will have a number of terms equal to the number of poles in the transfer function.

Figure 11:
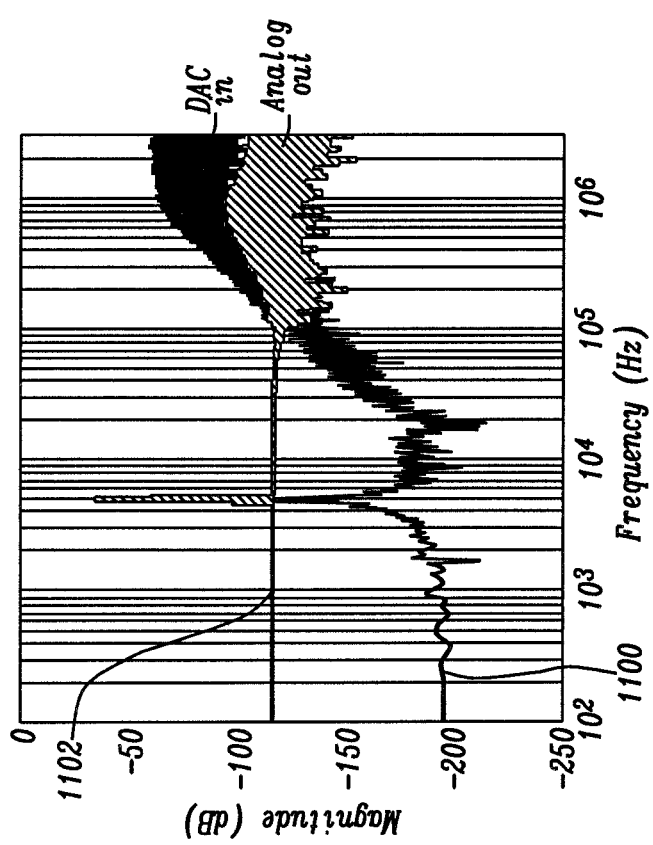
FIG. 11 shows simulations results of the Fourier transform of the output signal of the apparatus of FIG. 2, where the apparatus comprises a DAC functioning as an IIR filter.

FIG. 11 shows simulation results for the DRE circuit 200 where the DAC 202 functions as an IIR filter and no error correction signal $d_e[n]$ is applied. The simulations were performed using parameters that are representative of a practical implementation of the DRE circuit 200.

FIG. 11 shows a trace 1100 of the Fourier transform of the output signal a[n] and a trace 1102 of the Fourier transform of the signal that is received at the DAC 202 from the amplifier circuit 102.

The trace 1102 shows a 6 dB step applied to the input signal d[n] by the amplifier circuit 102. The flat portion of the output signal a[n] 1100 at low frequencies is due to the error arising due to the gain change.

Figure 12:
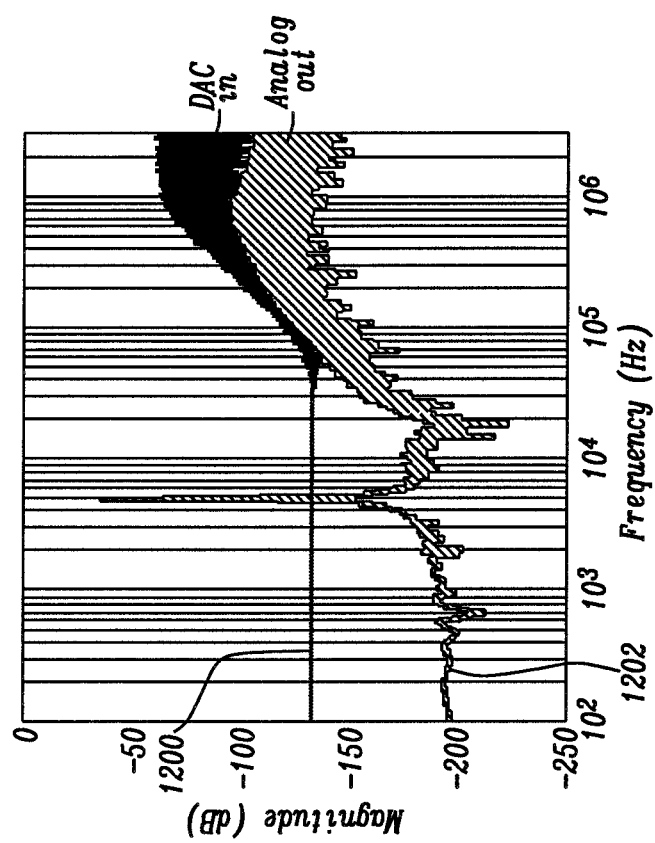
FIG. 12 shows simulation results of the Fourier transform of the output signal of the apparatus of FIG. 6A, where the apparatus comprises a DAC functioning as an IIR filter.

FIG. 12 shows simulation results for the apparatus 600 where the DAC 202 functions as an IIR filter, and the error correction signal $d_e[n]$ is applied. The simulations were performed using parameters that are representative of a practical implementation of the apparatus 600. The error correction signal $d_e[n]$ corresponds to the error correction signal $d_e[0]$ that may be derived using equation (11).

FIG. 12 shows a trace 1200 of the Fourier transform of the output signal a[n] and a trace 1202 of the Fourier transform of the corrected signal 510 that is received at the DAC 202 from the amplifier circuit 102.

The flat portion of the corrected signal 510 that is received at the DAC 202 is because the error correction signal $d_e[n]$ has been added to the input signal d[n] with equal magnitude and opposite sign to the error arising due to the gain change of the DRE circuit 504. Therefore, the output signal a[n] is substantially free from errors that arise due to the gain change associated with the DRE circuit 504.

The appropriate error correction signal $d_e[n]$ to reduce the error arising due to the gain change for a DAC 202 functioning as an FIR filter is given by equation (12).

$$d_e[n] = -\left(1 - \frac{1}{G}\frac{1}{g_a[n-1]}\right)\sum_{i=n-M+1}^{n-1} d[i] + \frac{1}{G}\frac{1}{g_a[n-1]}d[n-M] - \frac{1}{G}\left(\frac{(d[n]*h[n])}{g_a[n]} \times h^{-1}[n-M]\right) \qquad (12)$$

where G is a gain, i is an integer and M is an integer. The derivation of equation (12) will be clear to the skilled person.

Figure 13:
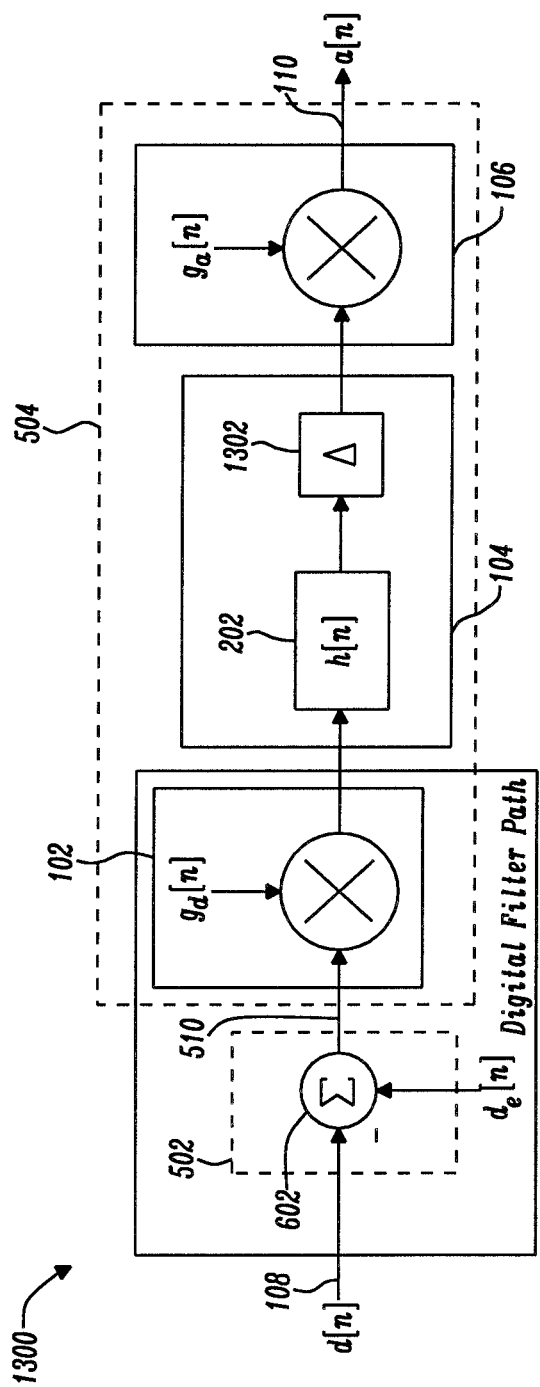
FIG. 13 is a schematic of an apparatus in accordance with a thirteenth embodiment of the present disclosure.

FIG. 13 shows an apparatus 1300 in accordance with a thirteenth embodiment of this disclosure. The apparatus 1300 corresponds to the apparatus 600 with an arbitrary delay 1302 (and represented by Δ) that may be introduced into the corrected signal 510 during processing by the processing circuit 104. The delay 1302 may be constant with frequency and is characteristic of most practical implementations of a DRE circuit.

In the present embodiment, the delay 1302 can compensated by modifying the impulse response h[n] used to determine the error correction signal $d_e[n]$ to account for the delay 1302. Therefore, the corrected signal 510 accounts for both the error due to the gain change, and the error arising due to the delay 1302. It will be appreciated that one or both of these errors may be compensated for using the present embodiment, in accordance with the understanding of the skilled person.

Figure 14:
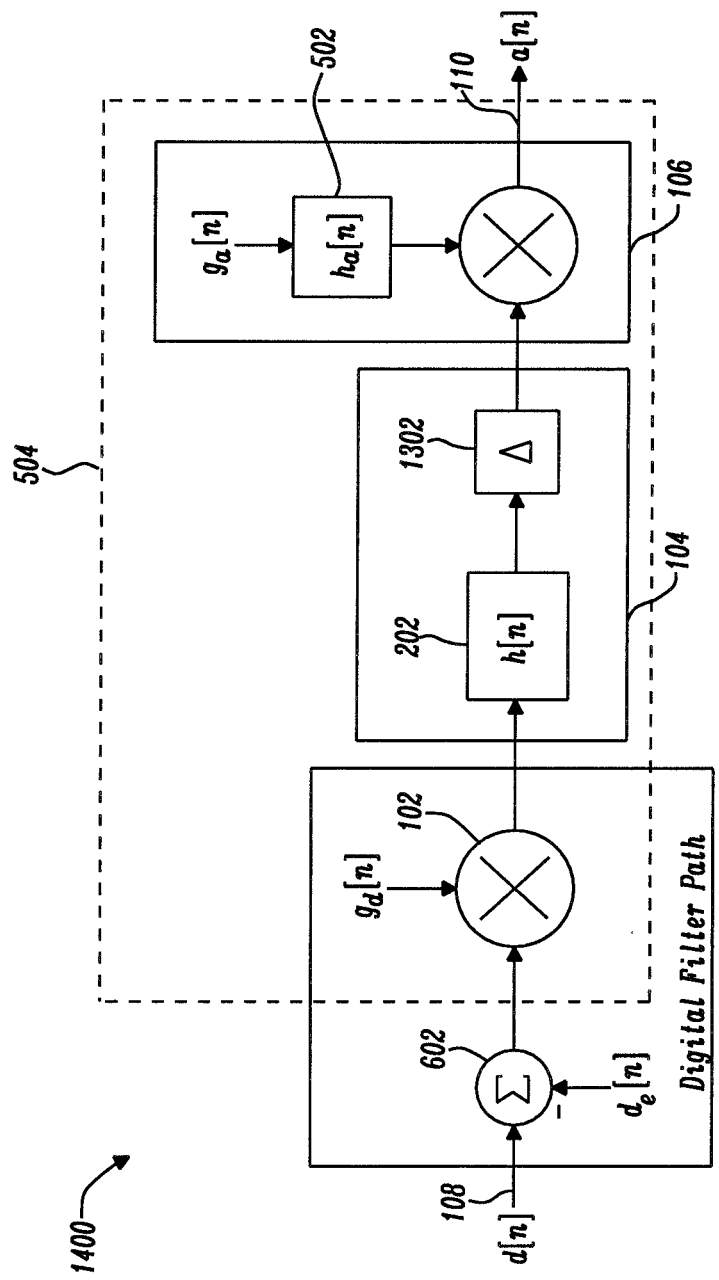
FIG. 14 is a schematic of an apparatus in accordance with a fourteenth embodiment of the present disclosure.

FIG. 14 shows an apparatus 1400 in accordance with a fourteenth embodiment of this disclosure. The apparatus 1400 corresponds to the apparatus 500 but with specific implementations of the error correction circuit 502 and the DRE circuit 504. Common features between different Figures are represented by common reference numerals and common variables. In the apparatus 1400, the DRE circuit 504 comprises the error correction circuit 502. The input signal d[n] is adjusted by the error correction circuit 502 based on an error correction factor prior to being output by the attenuation circuit 106 as the DRE output signal a[n].

In this specific embodiment, the attenuation circuit 106 comprises the error correction circuit 502. The error correction circuit 502 is configured to adjust the attenuation applied by the attenuation circuit 106 based on the error correction factor, where the error correction factor comprises a transfer function $h_a[n]$. The attenuation applied by the attenuation circuit is dependent on the dynamic analog gain $g_a[n]$. In this specific embodiment, the error correction factor is representative of the error generated by the DRE circuit 504, and in particular the error resulting from the delay 1302.

The error correction circuit 502 applies the error correction factor to the input signal d[n] by applying the transfer function $h_a[n]$ to the dynamic analog gain $g_a[n]$ thereby adjusting the attenuation applied to the input signal d[n] received by the attenuation circuit 106.

In effect, the error correction circuit 502 and the error correction factor comprising the transfer function $h_a[n]$ adds a delay (matching the delay 1302) to the dynamic analog gain $g_a[n]$, thereby compensating for the delay 1302.

In this embodiment the error correction circuit 502 may be implemented using analog or digital circuitry. The delay 1302 does not result in additional error when the gain is changed and the delay provided by the transfer function $h_a[n]$ may be made arbitrarily large within the confines of the apparatus 1400.

It can be observed that the error is also compensated for in the apparatus 1400 using the summing circuit 602 and the error correction signal $d_e[n]$. It will be appreciated that one or both of these error correction techniques may be applied in a single embodiment. Additionally, the method of correcting the error due to the delay 1302 may be applied to any of the embodiments presented herein, in accordance with the understanding of the skilled person.

Generally speaking, the method of applying the error correction signal $d_e[n]$ to the feedback loop of the sigma delta modulator (for example the sigma delta modulator 702 of the apparatus 710) may be used for A/D or D/A signal paths, in accordance with the understanding of the skilled person. For example, for an A/D signal path, the processing circuit 104 may comprise an ADC.

When DRE is used, the input signal $d[n]$ may be sufficiently small such that adding the error correction signal $d_e[n]$ to the feedback loop of the sigma delta modulator (for example the sigma delta modulator 702 of the apparatus 710) does not compromise stability of the apparatus.

The embodiments present herein can improve the dynamic range performance of a DRE circuit without the standard power penalty to lower thermal noise. The apparatus 600 described for the fifth embodiment may be used in any high-resolution signal path that employs a DRE circuit. The apparatuses comprising a sigma delta modulator can be used in any signal path that incorporates both a sigma delta modulator and a DRE circuit.

The embodiments disclosed herein may be generalised for use in both audio input and audio output signal paths, in accordance with the understanding of the skilled person. The embodiments of the present disclosure may be applied solely in the digital domain, particularly when DRE is applied to a D/A signal path. With a digital implementation, the circuit can be verified, production test screened and easily ported to different technologies.

The embodiments of the present disclosure do not rely on an analog-digital feedback loop for correction. By using a feedforward rather than feedback method, there are no concerns with the stability of large analog-digital feedback loop. Additionally, addition of the error correction signal $d_e[n]$ to a sigma delta modulator loop does not compromise stability.

Various improvements and modifications may be made to the above without departing from the scope of the disclosure.

What is claimed is:

1. An apparatus configured to receive an input signal and to provide a DRE output signal, the apparatus comprising:
   an error correction circuit configured to apply an error correction factor to the input signal such that the DRE output signal provided by the apparatus is dependent on the input signal and the error correction factor; and:
   a (dynamic range enhancement) DRE-circuit comprising:
      i) an amplifier circuit configured to amplify the input signal;
      ii) a processing circuit configured to receive the input signal from the amplifier circuit and to process the input signal; and
      iii) an attenuation circuit configured to receive the input signal from the processing circuit, to attenuate the input signal and to provide the input signal as an output of the attenuation circuit;
   wherein:
      the error correction factor is representative of an error generated by the DRE apparatus;
      the DRE output signal corresponds to the input signal output by the attenuation circuit; and
      the input signal is adjusted by the error correction circuit based on the error correction factor prior to being output by the attenuation circuit as the DRE output signal.

2. The apparatus of claim 1, comprising:
   a DRE circuit; wherein:
      the error correction circuit is configured to receive the input signal and to provide a corrected signal based on the input signal and the error correction factor; and
      the DRE circuit is configured to receive the corrected signal and to provide the DRE output signal based on the received corrected signal.

3. The apparatus of claim 2, wherein the DRE circuit comprises:
   an amplifier circuit configured to amplify the corrected signal;
   a processing circuit configured to receive the corrected signal from the amplifier circuit and to process the corrected signal; and
   an attenuation circuit configured to receive the corrected signal from the processing circuit, to attenuate the corrected signal and to provide the corrected signal as an output of the attenuation circuit; wherein:
      the DRE output signal corresponds to the corrected signal output by the attenuation circuit.

4. The apparatus of claim 3, wherein the processing circuit comprises:
   a digital to analog converter (DAC) configured to receive the corrected signal from the amplifier circuit, wherein processing the corrected signal comprises converting the corrected signal from digital to analog using the DAC.

5. The apparatus of claim 3, wherein the error correction circuit comprises a summing circuit configured to generate the corrected signal by adding or subtracting the error correction factor from the input signal, the corrected signal being provided at an output of the error correction circuit.

6. The apparatus of claim 5, comprising a sigma delta modulator comprising the error correction circuit, wherein the sigma delta modulator is configured to reduce the resolution of the corrected signal prior to the corrected signal being received by the processing circuit.

7. The apparatus of claim 6, wherein the sigma delta modulator comprises:
   a loop filter; and
   a quantiser configured to reduce the resolution of the corrected signal prior to the corrected signal being received by the processing circuit; wherein:
      the loop filter comprises a first input for receiving the corrected signal and an output coupled to the quantiser; and
      the quantiser has an output coupled to the processing circuit and a second input of the loop filter.

8. The apparatus of claim 7, wherein the output of the quantiser is coupled to the processing circuit via the amplifier circuit.

9. The apparatus of claim 7, wherein the loop filter is coupled to the quantiser via the amplifier circuit and the output of the quantiser is coupled to the second input the loop filter via a second amplifier circuit.

10. The apparatus of claim 3, comprising a sigma delta modulator comprising the error correction circuit, wherein the sigma delta modulator is configured to reduce the resolution of the corrected signal prior to the corrected signal being received by the processing circuit.

11. The apparatus of claim 10, wherein:
the error correction circuit comprises:
a loop filter comprising a first input for receiving the input signal; and
a summing circuit comprising a first input for receiving the error correction factor and an output coupled to the second input of the loop filter; and
the sigma delta modulator comprises:
a quantiser; wherein:
the loop filter comprises an output coupled to the quantiser, wherein the corrected signal is provided at the output of the loop filter; and
the quantiser has an output coupled to the processing circuit and a second input of the summing circuit.

12. The apparatus of claim 11, wherein the output of the quantiser is coupled to the processing circuit via the amplifier circuit.

13. The apparatus of claim 11, wherein the loop filter is coupled to the quantiser via the amplifier circuit and the output of the quantiser is coupled to the second input of the loop filter via a second amplifier circuit.

14. The apparatus of claim 1, comprising a memory element configured to store the error correction factor and to provide the error correction factor to the error correction circuit.

15. The apparatus of claim 1, wherein the error correction factor is derived by calculating the error generated by the apparatus.

16. The apparatus of claim 1, comprising an error correction factor generator configured to:
detect the error generated by the apparatus;
to generate the error correction factor using the detected error; and
to provide the error correction factor to error correction circuit.

17. The apparatus of claim 1, wherein the DRE circuit comprises the error correction circuit.

18. The apparatus of claim 17, wherein:
the attenuation circuit comprises the error correction circuit; and
the error correction circuit is configured to adjust the attenuation applied by the attenuation circuit based on the error correction factor.

19. The apparatus of claim 1, wherein the error generated by the apparatus results from at least one of a gain change or a delay.

20. The apparatus of claim 1, wherein the error correction circuit is configured to receive the error correction factor.

21. A method of dynamic range enhancement (DRE) using an apparatus comprising an error correction circuit and a DRE circuit, the method comprising the steps of:
receiving an input signal at the apparatus;
applying an error correction factor to the input signal using the error correction circuit;
amplifying the input signal using an amplifier circuit of the DRE circuit;
receiving the input signal from the amplifier circuit using a processing circuit of the DRE circuit;
processing the input signal using the processing circuit;
receiving the input signal from the processing circuit using an attenuation circuit of the DRE circuit;
attenuating the input signal using the attenuation circuit; and
providing the input signal as an output of the attenuation circuit, the input signal output by the attenuation circuit corresponding to a DRE output signal; and
wherein:
the DRE output signal provided by the apparatus is dependent on the input signal and the error correction factor;
the error correction factor is representative of an error generated by the apparatus; and
the input signal is adjusted by the error correction circuit based on the error correction factor prior to being output by the attenuation circuit as the DRE output signal.

* * * * *